United States Patent
Fukazawa et al.

(10) Patent No.: US 9,633,887 B2
(45) Date of Patent: Apr. 25, 2017

(54) WORKPIECE CUTTING METHOD

(71) Applicant: DISCO CORPORATION, Tokyo (JP)

(72) Inventors: Takashi Fukazawa, Tokyo (JP); Hiroshi Onodera, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/098,902

(22) Filed: Apr. 14, 2016

(65) Prior Publication Data

US 2016/0307789 A1    Oct. 20, 2016

(30) Foreign Application Priority Data

Apr. 15, 2015 (JP) ................................ 2015-082988

(51) Int. Cl.
*H01L 21/67* (2006.01)
*H01L 21/78* (2006.01)
*H01L 21/683* (2006.01)

(52) U.S. Cl.
CPC .... *H01L 21/6835* (2013.01); *H01L 21/67132* (2013.01); *H01L 21/78* (2013.01); *H01L 2221/68327* (2013.01)

(58) Field of Classification Search
None
See application file for complete search history.

(56) References Cited

U.S. PATENT DOCUMENTS

| 2013/0224932 A9* | 8/2013 | Inada | C09J 7/0242 438/464 |
| 2016/0168422 A1* | 6/2016 | Iwai | C09J 4/00 428/339 |

FOREIGN PATENT DOCUMENTS

JP    2010-155298    7/2010

* cited by examiner

*Primary Examiner* — Asok K Sarkar
(74) *Attorney, Agent, or Firm* — Greer Burns & Crain, Ltd.

(57) ABSTRACT

A workpiece cutting method is provided. The workpiece cutting method includes an attaching step of attaching an adhesive tape to the front side or back side of a workpiece, an applying step of applying a liquid resin to the front side or back side of a support member, a pressing step of superimposing the workpiece on the support member in the condition where the liquid resin and the adhesive tape come into contact with each other, and then pressing the workpiece or the support member, a fixing step of curing the liquid resin to thereby fix the workpiece to the support member, and a cutting step of cutting the workpiece fixed to the support member by using a cutting blade.

17 Claims, 3 Drawing Sheets

WORKPIECE CUTTING METHOD

BACKGROUND OF THE INVENTION

Field of the Invention

The present invention relates to a workpiece cutting method for cutting a platelike workpiece.

Description of the Related Art

Semiconductor chips including electronic circuits such as ICs and LSIs are incorporated in various electronic equipment such as mobile phones. These semiconductor chips are obtained by using a wafer formed of a semiconductor material such as silicon, next partitioning the front side of the wafer along a plurality of division lines (streets) to thereby define a plurality of separate regions on the front side of the wafer, next forming a device in each region, and finally cutting the wafer along the division lines.

A platelike workpiece represented by such a wafer is cut in the condition where it is held through an adhesive tape on a chuck table under suction. However, the workpiece is not always sufficiently flat. Accordingly, there is a case that the workpiece cannot be properly held on the chuck table under suction.

To cope with this problem, there has been proposed a method of fixing the workpiece to a support member having high flatness which can be properly held on the chuck table under suction (see Japanese Patent Laid-open No. 2010-155298, for example). In this method, the workpiece is fixed through an ultraviolet curing resin to the support member, thereby allowing the workpiece having low flatness to be properly held on the chuck table under suction.

SUMMARY OF THE INVENTION

However, when the workpiece fixed to the support member by the above method is cut by using a cutting blade, there is a possibility that semiconductor chips cut from the workpiece may be separated from the ultraviolet curing resin to scatter.

It is therefore an object of the present invention to provide a workpiece cutting method which can properly cut a workpiece.

In accordance with a first aspect of the present invention, there is provided a workpiece cutting method including an attaching step of attaching an adhesive tape to the front side or back side of a workpiece; an applying step of applying a liquid resin to the front side or back side of a support member; a pressing step of superimposing the workpiece on the support member in the condition where the liquid resin and the adhesive tape come into contact with each other, and then pressing the workpiece or the support member; a fixing step of curing the liquid resin to thereby fix the workpiece to the support member; and a cutting step of cutting the workpiece fixed to the support member by using a cutting blade.

In accordance with a second aspect of the present invention, there is provided a workpiece cutting method including an attaching step of attaching an adhesive tape to the front side or back side of a workpiece; an applying step of applying a liquid resin to the adhesive tape attached to the workpiece; a pressing step of superimposing the workpiece on a support member in the condition where the liquid resin comes into contact with the front side or back side of the support member, and then pressing the workpiece or the support member; a fixing step of curing the liquid resin to thereby fix the workpiece to the support member; and a cutting step of cutting the workpiece fixed to the support member by using a cutting blade.

Preferably, the liquid resin includes an ultraviolet curing resin curable by ultraviolet radiation.

In the workpiece cutting method according to the first aspect of the present invention mentioned above, the adhesive tape is attached to the front side or back side of the workpiece, and the liquid resin is applied to the front side or back side of the support member. Thereafter, the workpiece is superimposed on the support member so that the liquid resin and the adhesive tape come into contact with each other, and the workpiece or the support member is then pressed. Thereafter, the liquid resin is cured. Further, in the workpiece cutting method according to the second aspect of the present invention, the adhesive tape is attached to the front side or back side of the workpiece, and the liquid resin is applied to the adhesive tape attached to the workpiece. Thereafter, the workpiece is superimposed on the support member so that the liquid resin comes into contact with the front side or back side of the support member, and the workpiece or the support member is then pressed. Thereafter, the liquid resin is cured. As a result, the workpiece is fixed through the adhesive tape and the cured resin to the support member. Accordingly, by using the adhesive tape having sufficient adhesive strength, separation of the workpiece from the support member can be prevented even in the case that the adhesive strength of the cured resin is low. Thusly, the workpiece can be properly cut according to the workpiece cutting method of the present invention.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The workpiece cutting method according to this preferred embodiment includes an attaching step (see FIG. 1A), applying step (see FIG. 1B), pressing step (see FIG. 1C and FIG. 2), fixing step (see FIG. 2 and FIG. 3A), and cutting step (see FIG. 3B). In the attaching step, an adhesive tape is attached to a workpiece. In the applying step, a liquid resin is applied to a support member. In the pressing step, the workpiece is superimposed on the support member so that the liquid resin and the adhesive tape come into contact with each other, and the workpiece is then pressed against the support member. In the fixing step, the liquid resin is cured to thereby fix the workpiece to the support member. In the cutting step, the workpiece fixed to the support member is cut by using a cutting blade. The workpiece cutting method according to this preferred embodiment will now be described in more detail.

Figure 1A:
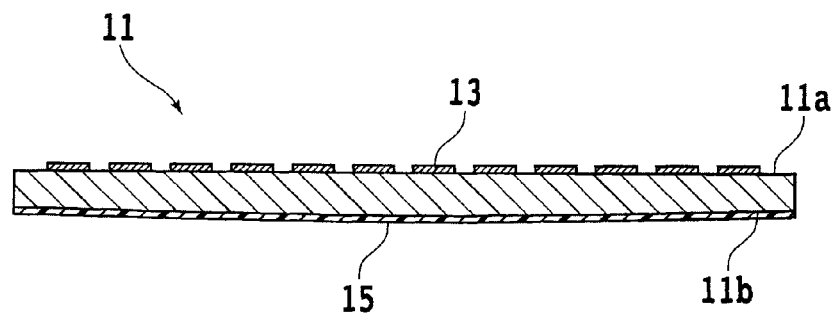
FIG. 1A is a schematic sectional view showing an attaching step.

In the workpiece cutting method according to this preferred embodiment, an attaching step is performed in such a manner that an adhesive tape is attached to a workpiece. FIG. 1A is a schematic sectional view showing the attaching step. In FIG. 1A, reference numeral 11 denotes a workpiece. For example, the workpiece 11 is a circular wafer formed of a semiconductor material such as silicon. The workpiece 11 has a front side 11a and a back side 11b. The front side 11a of the workpiece 11 is composed of a central device area and a peripheral marginal area surrounding the device area. The device area is partitioned into a plurality of separate regions by a plurality of crossing division lines (streets). In each region, a device 13 such as IC and LSI is formed. As shown in FIG. 1A, the back side 11b of the workpiece 11 is slightly uneven. That is, the back side 11b has low flatness. In this attaching step, an adhesive tape 15 is attached to the back side 11b of the workpiece 11.

The adhesive tape 15 includes a base sheet like a film formed of resin, for example. An adhesive layer is formed on one side of this base sheet. The adhesive layer has sufficient adhesive strength to the back side 11b of the workpiece 11. In this attaching step, the adhesive layer of the adhesive tape 15 is brought into close contact with the back side 11b of the workpiece 11. Accordingly, the adhesive tape 15 can be attached to the workpiece 11 as shown in FIG. 1A. While the adhesive layer is formed on one side of the base sheet constituting the adhesive tape 15 in this preferred embodiment, the adhesive tape 15 may be an adhesive tape (so-called double-sided tape) composed of a base sheet and adhesive layers formed on both sides of the base sheet. Further, in the case that the workpiece 11 is desired to be cut from the back side 11b in the cutting step to be hereinafter described, the adhesive tape 15 may be attached to the front side 11a of the workpiece 11.

Figure 1B:
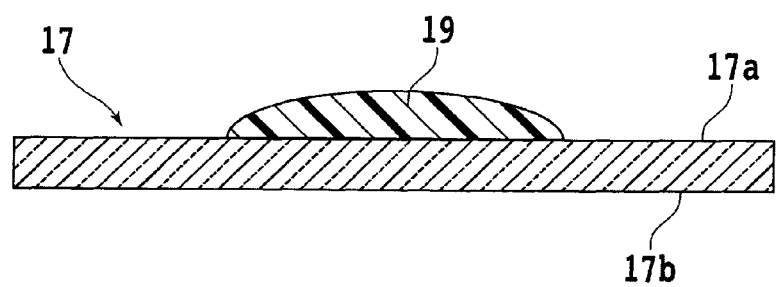
FIG. 1B is a schematic sectional view showing an applying step.

After performing the attaching step, an applying step is performed in such a manner that a liquid resin is applied to a support member. FIG. 1B is a schematic sectional view showing the applying step. In FIG. 1B, reference numeral 17 denotes a support member. For example, the support member 17 is a circular wafer formed of a material such as borate glass, silica glass, and alumina. The support member 17 can transmit ultraviolet radiation (ultraviolet light) to be used in the fixing step to be hereinafter described. The support member 17 has a front side 17a and a back side 17b. Both the front side 17a and the back side 17b of the support member 17 are substantially flat. In the applying step according to this preferred embodiment, a liquid resin (ultraviolet curing resin) 19 curable by ultraviolet radiation is applied to the front side 17a of the support member 17. More specifically, the liquid resin 19 is dropped onto a central portion of the front side 17a of the support member 17. As a modification, the liquid resin 19 may be applied to the back side 17b of the support member 17.

Figure 1C:
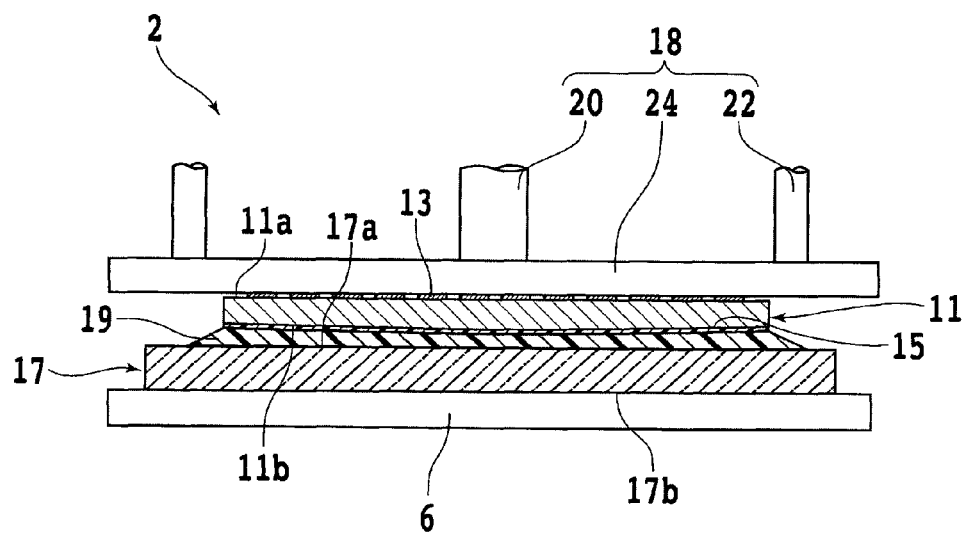
FIG. 1C is a partially sectional side view schematically showing a pressing step.

After performing the applying step, a pressing step is performed in such a manner that the workpiece 11 is superimposed on the support member 17 in the condition where the liquid resin 19 and the adhesive tape 15 come into contact with each other and the workpiece 11 is next pressed against the support member 17. FIG. 1C is a partially sectional side view schematically showing the pressing step, and FIG. 2 is a partially cutaway perspective view schematically showing a pressing and fixing apparatus to be used in the pressing step and the fixing step subsequent thereto.

Figure 2:
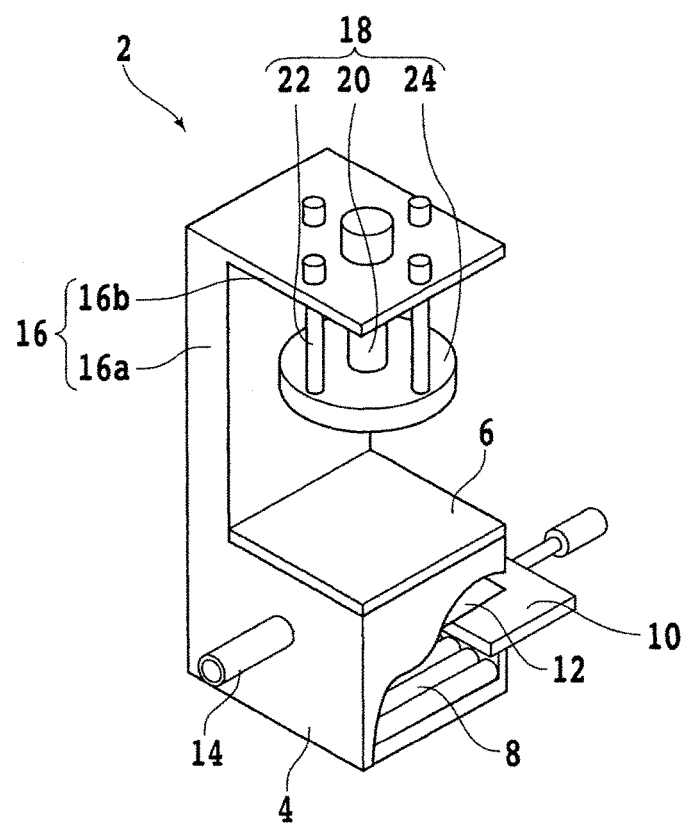
FIG. 2 is a partially cutaway perspective view schematically showing a pressing and fixing apparatus to be used in the pressing step and a fixing step.

Referring to FIG. 2, the pressing and fixing apparatus is shown by reference numeral 2. The pressing and fixing apparatus 2 includes a boxlike base 4 having an inside space. A stage 6 having a substantially flat upper surface is provided at the upper portion of the base 4 so as to enclose the inside space. The stage 6 is formed of a material such as borate glass, silica glass, and alumina. The stage 6 can transmit ultraviolet radiation (ultraviolet light). The upper surface of the stage 6 functions as a support surface for supporting the support member 17. A light source 8 for emitting ultraviolet radiation is provided below the stage 6. A shutter 10 for blocking the ultraviolet radiation emitted from the light source 8 is provided between the stage 6 and the light source 8. Further, a filter 12 for cutting off light having a wavelength unnecessary for curing of the liquid resin 19 is provided above the shutter 10. Accordingly, when the shutter 10 is fully closed, the ultraviolet radiation from the light source 8 is blocked by the shutter 10, so that the ultraviolet radiation does not reach the stage 6. Conversely, when the shutter 10 is opened, the ultraviolet radiation from the light source 8 is transmitted through the filter 12 and the stage 6 and applied to the support member 17.

An evacuation pipe 14 is provided on a side wall of the base 4 so as to communicate with the inside space of the base 4. This evacuation pipe 14 is connected to a vacuum pump (not shown) or the like provided outside the base 4. When the temperature inside the base 4 rises due to the light from the light source 8, there is a possibility that the stage 6 may be deformed to cause a reduction in flatness of the support surface of the stage 6. To cope with this problem, the inside space of the base 4 is evacuated through the evacuation pipe 14 connected to the vacuum pump, thereby suppressing a temperature rise inside the base 4. A support structure 16 is provided at a position adjacent to the stage 6. The support structure 16 includes a column portion 16a extending upward from the base 4 and a support portion 16b horizontally projecting from the upper end of the column portion 16a. A pressing mechanism 18 for downward pressing the workpiece 11 is provided at the center of the support portion 16b.

The pressing mechanism 18 includes a central main rod 20 extending vertically and a plurality of (four in this preferred embodiment) sub-rods 22 extending parallel to the main rod 20. The plural sub-rods 22 are arranged at substantially equal intervals around the main rod 20. A disk-shaped pressing plate 24 having a shape corresponding to the shape of the workpiece 11 is fixed to the lower ends of the main rod 20 and the plural sub-rods 22. The main rod 20 and the plural sub-rods 22 are connected to an elevating mechanism (not shown) including a motor etc. By operating the elevating mechanism to lower the main rod 20 and the plural sub-rods 22, the pressing plate 24 can apply a pressure to the front side 11a of the workpiece 11. The elevating mechanism can individually move the main rod 20 and the plural sub-rods 22 in the vertical direction, thereby adjusting the pressure applied to the workpiece 11.

In performing the pressing step, the support member 17 is first placed on the stage 6 so that the back side 17b of the support member 17 comes into contact with the support surface of the stage 6. Thereafter, the workpiece 11 is superimposed on the support member 17 so that the liquid resin 19 and the adhesive tape 15 come into contact with each other. Thereafter, the pressing plate 24 is lowered to downward press the workpiece 11 as shown in FIG. 1C. Accordingly, the liquid resin 19 can be uniformly spread between the front side 17a of the support member 17 and the back side 11b of the workpiece (i.e., the adhesive tape 15 attached to the back side 11b of the workpiece 11). After uniformly spreading the liquid resin 19, the pressing plate 24 is raised.

Figure 3A:
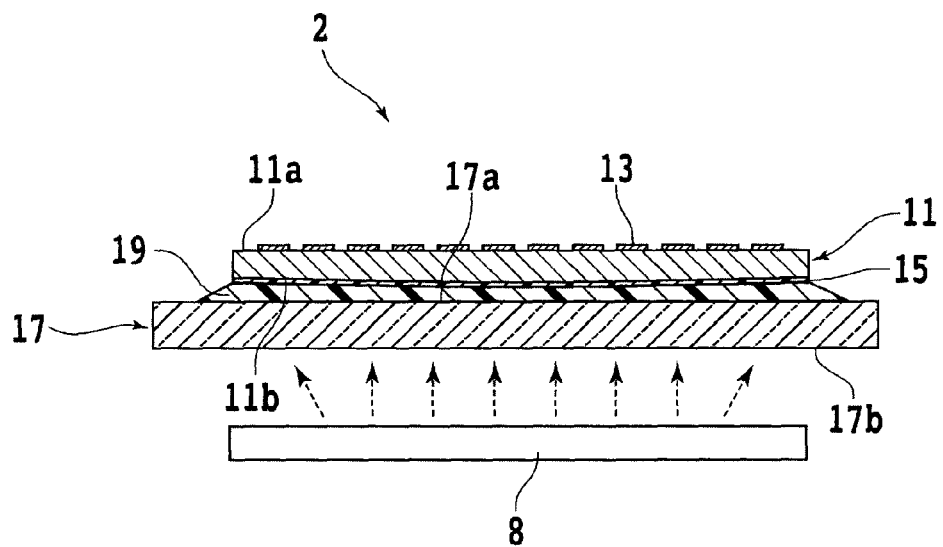
FIG. 3A is a partially sectional side view schematically showing the fixing step.

After performing the pressing step, a fixing step is performed in such a manner that the liquid resin 19 is cured to fix the workpiece 11 to the support member 17. FIG. 3A is a partially sectional side view schematically showing the fixing step. In performing the fixing step, ultraviolet radiation is emitted from the light source 8 as shown in FIG. 3A and the shutter 10 (see FIG. 2) is opened. When the shutter 10 is opened, the ultraviolet radiation from the light source 8 is transmitted through the filter 12 and the stage 6 and then applied to the support member 17. Since the support member 17 is formed of a material that can transmit ultraviolet radiation, the liquid resin 19 is cured by the ultraviolet radiation transmitted through the support member 17. Accordingly, the workpiece 11 can be fixed to the support member 17.

Figure 3B:
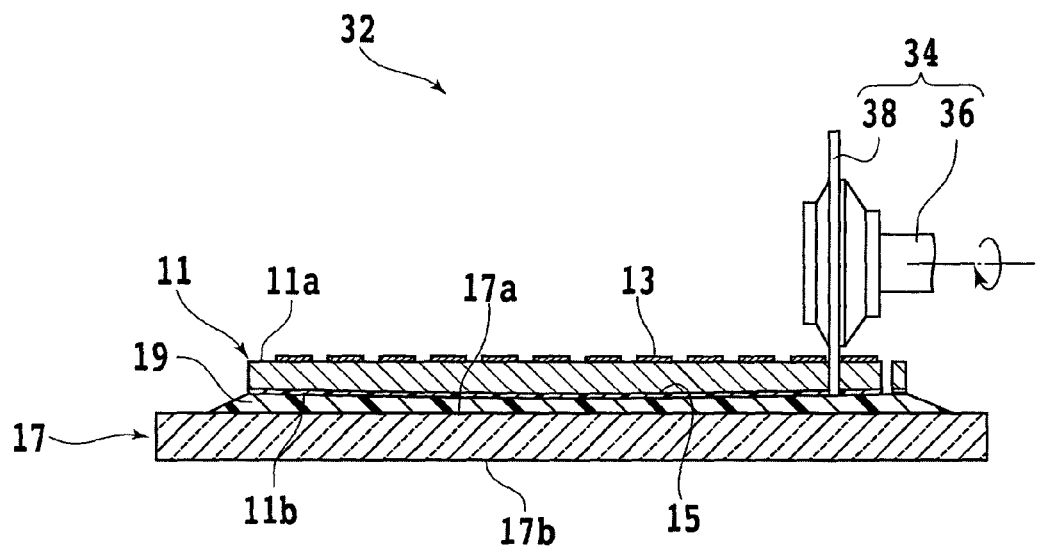
FIG. 3B is a partially sectional side view schematically showing a cutting step.

After performing the fixing step, a cutting step is performed in such a manner that the workpiece 11 fixed to the support member 17 is cut by using a cutting blade. FIG. 3B is a partially sectional side view schematically showing the cutting step. For example, the cutting step is performed by using a cutting apparatus 32 shown in FIG. 3B.

The cutting apparatus 32 includes a chuck table (not shown) for holding the back side 17b of the support member 17. This chuck table is connected to a rotating mechanism (not shown) including a motor. That is, the chuck table is rotatable about its axis substantially parallel to a vertical direction by operating this rotating mechanism. Further, a moving mechanism (not shown) is provided below the chuck table to move the chuck table in a horizontal direction. The chuck table has an upper surface functioning as a holding surface for holding the back side 17b of the support member 17. The holding surface of the chuck table is connected to a vacuum source through a passage formed inside the chuck table. Accordingly, a vacuum generated from the vacuum source acts on the holding surface to thereby produce a suction force for holding the support member 17 on the holding surface under suction.

A cutting unit 34 is provided above the chuck table. The cutting unit 34 includes a spindle housing (not shown) supported to an elevating mechanism (not shown). The spindle housing contains a spindle 36 connected to a rotating mechanism (not shown) including a motor. The spindle 36 is rotatable about its axis substantially parallel to a horizontal direction by the torque transmitted from the rotating mechanism. Further, the spindle 36 is vertically movable with the spindle housing by operating the elevating mechanism. The spindle 36 is exposed at one end portion thereof to the outside of the spindle housing. An annular cutting blade 38 is mounted on this one end portion of the spindle 36.

In performing the cutting step, the back side 17b of the support member 17 is brought into contact with the holding surface of the chuck table, and the vacuum generated by the vacuum source is applied to the holding surface of the chuck table. As a result, the workpiece 11 fixed to the support member 17 is held through the support member 17 on the holding surface of the chuck table under suction in the condition where the front side 11a of the workpiece 11 is exposed upward. Thereafter, the chuck table and the cutting blade 38 are relatively moved and rotated to thereby align the cutting blade 38 with a target one of the division lines formed on the front side 11a of the workpiece 11. Thereafter, the cutting blade 38 being rotated is lowered to a vertical position where it comes into contact with the workpiece 11. Thereafter, the chuck table is moved in the direction parallel to the target division line. At this time, the depth of cut by the cutting blade 38 is set to a value greater than or equal to the thickness of the workpiece 11. Accordingly, the workpiece 11 can be cut along the target division line. This procedure is repeated for all of the other division lines to thereby divide the workpiece 11 into a plurality of semiconductor chips respectively corresponding to the plural devices 13. Thus, the cutting step is finished.

In the workpiece cutting method according to this preferred embodiment, the adhesive tape 15 is first attached to the back side 11b of the workpiece 11, and the liquid resin 19 is next applied to the front side 17a of the support member 17. Thereafter, the workpiece 11 is superimposed on the support member 17 so that the liquid resin 19 and the adhesive tape 15 come into contact with each other, and the workpiece 11 is next pressed against the support member 17. Thereafter, the liquid resin 19 is cured, so that the workpiece 11 is fixed through the adhesive tape 15 and the liquid resin 19 cured to the support member 17. Accordingly, by using the adhesive tape 15 having sufficient adhesive strength, separation of the workpiece 11 from the support member 17 can be prevented even in the case that the adhesive strength of the liquid resin 19 cured is low.

The present invention is not limited to the above preferred embodiment, but various modifications may be made. For example, while the applying step is performed after performing the attaching step in the above preferred embodiment, the applying step may be performed before performing the attaching step. In other words, the attaching step may be performed after performing the applying step. Further, while the workpiece 11 is pressed against the support member 17 by using the pressing plate 24 in the pressing step mentioned above, the support member 17 may be pressed against the workpiece 11.

Further, while the liquid resin 19 is applied to the support member 17 in the applying step mentioned above, the liquid resin 19 may be applied to the adhesive tape 15 attached to the workpiece 11. In this case, the pressing step is performed in such a manner that the workpiece 11 is superimposed on the support member 17 in the condition where the liquid resin 19 applied to the adhesive tape 15 comes into contact with the front side 17a or the back side 17b of the support member 17.

Further, while an ultraviolet curing resin that can be cured by ultraviolet radiation is used as the liquid resin 19 in the above preferred embodiment, any other types of resins may be used in the present invention. Specifically, a wax that can be cured by the volatilization of a solvent may be used or a thermosetting resin etc. may also be used. In the case of using a wax in a conventional method, there is a possibility that the semiconductor chips obtained by dividing the workpiece cannot be easily picked up because the adhesive strength of the wax is too large. To the contrary, the workpiece cutting method according to the present invention has an advantage such that suitable adhesive strength can be obtained by the adhesive tape 15. Accordingly, also in such a case that a wax is used, the semiconductor chips can be easily picked up in the present invention. Further, in the case of using any types of resins other than the ultraviolet curing resin as the liquid resin 19, ultraviolet radiation is not used in the fixing step, so that the support member 17 may be formed of any material not transmitting ultraviolet radiation in this case.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A workpiece cutting method comprising:
an attaching step of attaching an adhesive tape to a back side of a workpiece, wherein the workpiece includes a plurality of devices on a front side thereof, and further wherein the front side of the workpiece faces in a direction opposite to the direction that the back side faces;
an applying step of applying a liquid resin to the front side or back side of a support member;
a pressing step of superimposing said workpiece on said support member in the condition where said liquid resin and said adhesive tape come into contact with each other, and then pressing said workpiece or said support member;
a fixing step of curing said liquid resin to thereby fix said workpiece to said support member; and
a cutting step of cutting said workpiece fixed to said support member by using a cutting blade.

2. The workpiece cutting method according to claim 1, wherein said liquid resin includes an ultraviolet curing resin curable by ultraviolet radiation.

3. The workpiece cutting method according to claim 1, wherein the adhesive tape comprises a double-sided tape that includes a base sheet with adhesive on both sides thereof.

4. The workpiece cutting method according to claim 1, wherein said cutting step is performed upon said workpiece while said support member is fixed to said workpiece, with said cured liquid resin and said adhesive tape positioned between said workpiece and said support member.

5. The workpiece cutting method according to claim 1, wherein:
said liquid resin includes an ultraviolet curable resin curable by ultraviolet radiation;
said fixing step comprises applying ultraviolet radiation to said liquid resin; and
said ultraviolet radiation passes through said support member prior to reaching said liquid resin.

6. The workpiece cutting method according to claim 1, wherein:
during said fixing step, the workpiece and the support member are located upon a stage of a pressing and fixing apparatus;
said liquid resin includes an ultraviolet curable resin curable by ultraviolet radiation;
said fixing step comprises applying ultraviolet radiation to said liquid resin; and
said ultraviolet radiation passes through both said stage and said support member prior to reaching said liquid resin.

7. A workpiece cutting method comprising:
an attaching step of attaching an adhesive tape to a back side of a workpiece, wherein the workpiece includes a plurality of devices on a front side thereof, and further wherein the front side of the workpiece faces in a direction opposite to the direction that the back side faces;
an applying step of applying a liquid resin to said adhesive tape attached to said workpiece;
a pressing step of superimposing said workpiece on a support member in the condition where said liquid resin comes into contact with the front side or back side of said support member, and then pressing said workpiece or said support member;
a fixing step of curing said liquid resin to thereby fix said workpiece to said support member; and
a cutting step of cutting said workpiece fixed to said support member by using a cutting blade.

8. The workpiece cutting method according to claim 7, wherein the adhesive tape comprises a double-sided tape that includes a base sheet with adhesive on both sides thereof.

9. The workpiece cutting method according to claim 7, wherein said cutting step is performed upon said workpiece while said support member is fixed to said workpiece, with said cured liquid resin and said adhesive tape positioned between said workpiece and said support member.

10. The workpiece cutting method according to claim 7, wherein:
said liquid resin includes an ultraviolet curable resin curable by ultraviolet radiation;
said fixing step comprises applying ultraviolet radiation to said liquid resin; and
said ultraviolet radiation passes through said support member prior to reaching said liquid resin.

11. The workpiece cutting method according to claim 7, wherein:
during said fixing step, the workpiece and the support member are located upon a stage of a pressing and fixing apparatus;
said liquid resin includes an ultraviolet curable resin curable by ultraviolet radiation;
said fixing step comprises applying ultraviolet radiation to said liquid resin; and
said ultraviolet radiation passes through both said stage and said support member prior to reaching said liquid resin.

12. A workpiece cutting method comprising:
an attaching step of attaching an adhesive tape to the front side or back side of a workpiece;
an applying step of applying a liquid resin to either the support member or to said adhesive tape attached to said workpiece;
a pressing step of superimposing said workpiece on said support member in the condition where said liquid resin is contacting both said adhesive tape and said support member, and then pressing said workpiece or said support member;
a fixing step of curing said liquid resin to thereby fix said workpiece to said support member; and
a cutting step of cutting said workpiece, which is fixed to said support member, into a plurality of devices by using a cutting blade,
wherein said cutting step is performed upon said workpiece while said support member is fixed to said workpiece, with said cured liquid resin and said adhesive tape positioned between said workpiece and said support member.

13. The workpiece cutting method according to claim 12, wherein said liquid resin includes an ultraviolet curing resin curable by ultraviolet radiation.

14. The workpiece cutting method according to claim 12, wherein the workpiece includes a plurality of devices on the front side thereof, and further wherein the front side of the workpiece faces in a direction opposite to the direction that the back side faces, and still further wherein said attaching step comprises attaching the adhesive tape to the back side of the workpiece.

15. The workpiece cutting method according to claim 12, wherein the adhesive tape comprises a double-sided tape that includes a base sheet with adhesive on both sides thereof.

16. The workpiece cutting method according to claim 12, wherein:
- said liquid resin includes an ultraviolet curable resin curable by ultraviolet radiation;
- said fixing step comprises applying ultraviolet radiation to said liquid resin; and
- said ultraviolet radiation passes through said support member prior to reaching said liquid resin.

17. The workpiece cutting method according to claim 12, wherein:
- during said fixing step, the workpiece and the support member are located upon a stage of a pressing and fixing apparatus;
- said liquid resin includes an ultraviolet curable resin curable by ultraviolet radiation;
- said fixing step comprises applying ultraviolet radiation to said liquid resin; and
- said ultraviolet radiation passes through both said stage and said support member prior to reaching said liquid resin.

* * * * *